United States Patent
Moon et al.

(10) Patent No.: US 10,714,605 B2
(45) Date of Patent: Jul. 14, 2020

(54) HIGHLY SCALED LINEAR GAN HEMT STRUCTURES

(71) Applicant: HRL Laboratories, LLC, Malibu, CA (US)

(72) Inventors: Jeong-Sun Moon, Moorpark, CA (US); Andrea Corrion, Oak Park, CA (US); Joel C. Wong, Simi Valley, CA (US); Adam J. Williams, Los Alamitos, CA (US)

(73) Assignee: HRL Laboratories, LLC, Malibu, CA (US)

( * ) Notice: Subject to any disclaimer, the term of this patent is extended or adjusted under 35 U.S.C. 154(b) by 29 days.

(21) Appl. No.: 16/217,714

(22) Filed: Dec. 12, 2018

(65) Prior Publication Data

US 2019/0252535 A1    Aug. 15, 2019

Related U.S. Application Data

(60) Provisional application No. 62/630,688, filed on Feb. 14, 2018.

(51) Int. Cl.
| | |
|---|---|
| *H01L 29/778* | (2006.01) |
| *H01L 29/20* | (2006.01) |
| *H01L 29/205* | (2006.01) |
| *H01L 21/02* | (2006.01) |
| *H01L 29/423* | (2006.01) |
| *H01L 29/10* | (2006.01) |
| *H01L 29/66* | (2006.01) |
| *H01L 29/417* | (2006.01) |
| *H01L 29/201* | (2006.01) |
| *H01L 29/08* | (2006.01) |

(52) U.S. Cl.
CPC ........ *H01L 29/778* (2013.01); *H01L 21/0254* (2013.01); *H01L 29/1029* (2013.01); *H01L 29/201* (2013.01); *H01L 29/2003* (2013.01); *H01L 29/205* (2013.01); *H01L 29/41775* (2013.01); *H01L 29/42316* (2013.01); *H01L 29/66462* (2013.01); *H01L 29/7783* (2013.01); *H01L 29/0843* (2013.01)

(58) Field of Classification Search
CPC .............. H01L 29/778; H01L 29/1029; H01L 29/66462
USPC ....................................................... 257/194
See application file for complete search history.

(56) References Cited

U.S. PATENT DOCUMENTS 7,405,443 B1    7/2008 Zuniga
9,368,622 B1*   6/2016 Boutros ............. H01L 29/7786
(Continued)

OTHER PUBLICATIONS

From U.S. Appl. No. 16/101,294 (unpublished; non-publication request filed), Office Action dated May 15, 2019.
(Continued)

*Primary Examiner* — Mark V Prenty
(74) *Attorney, Agent, or Firm* — Ladas & Parry

(57) ABSTRACT

A transistor includes a substrate, a channel layer coupled to the substrate, a source electrode coupled to the channel layer, a drain electrode coupled to the channel layer, and a gate electrode coupled to the channel layer between the source electrode and the drain electrode. The gate electrode has a length dimension of less than 50 nanometers near the channel layer, and the channel layer includes at least a first GaN layer and a first graded AlGaN layer on the first GaN layer.

26 Claims, 9 Drawing Sheets

(56) References Cited

U.S. PATENT DOCUMENTS

| | | |
|---|---|---|
| 9,379,327 B1 | 6/2016 | Rutherglen |
| 10,381,469 B2 * | 8/2019 | Tsuchiya ............ H01L 23/3185 |
| 2005/0006639 A1 | 1/2005 | Dupuis |
| 2005/0077538 A1 | 4/2005 | Heikman |
| 2006/0244011 A1 | 11/2006 | Saxler |
| 2007/0001239 A1 | 1/2007 | Deleonibus |
| 2009/0026501 A1 | 1/2009 | Maher |
| 2010/0301395 A1 | 12/2010 | Xu |
| 2012/0248416 A1 | 10/2012 | Zhou |
| 2014/0361343 A1 | 12/2014 | Sriram |
| 2017/0330940 A1 | 11/2017 | Lee |

OTHER PUBLICATIONS

PCT International Search Report and Written Opinion from PCT/US2018/065291 dated Apr. 22, 2019.

U.S. Appl. No. 16/101,294, filed Sep. 10, 2018.

Cao, Y., et al., "Radio frequency transistors using aligned semiconducting carbon nanotubes with current-gain cutoff frequency and maximum oscillation frequency simultaneously greater than 70 GHz", ACS Nano, vol. 10, pp. 6782-6790, 2016.

Chu, S.L.G., et al., "A highly linear MESFET", IEEE MTT-S Digest, 1991, pp. 725-728.

Hur, K. Y., "Ultralinear double pulse doped AlInAs/GaInAs/InP HEMTs", Electronics Letters, vol. 32, No. 16, pp. 1516-1518, 1996.

Ikalainen, P. K., "Low noise, low DC power linear FET", Microwave Conference, 1992, pp. 570-575.

Iwamoto, M., et al., "Linearity characteristics of GaAs HBTs and the influence of collector design", IEEE Transactions Microwave Theory and Techniques, vol. 48, No. 12, p. 2377-2388, Dec. 2000.

Moon, J.-S., et al., 2016 IEEE Topical Conference on Power Amplifiers for Wireless and Radio Applications (PAWR), pp. 5-7 (2016).

Moon, J.S., et al., "Linearity of low microwave noise AlGaN/GaN HEMTs", Electronics Letters, vol. 38, pp. 1358-1359, 2002.

Moon, J.S. et al., "70% Power-Added-Efficiency Dual-Gate, Cascode GaN HEMTs Without Harmonic Tuning", IEEE Electron Device Letters, vol. 37, No. 3, Mar. 2016, pp. 272-275.

Palacios, T., et al., "Use of Double-Channel Heterostructures to Improve the Access Resistance and Linearity in GaN-Based HEMTs," IEEE Transaction Electron Devices, vol. 53, No. 3., pp. 562-565, 2006.

Park, P., et al., "Electron gas dimensionality engineering in AlGaN/GaN high electron mobility transistors using polarization," Applied Physics Letters, vol. 100, pp. 063507-01 to 063507-03, 2012.

Rajan, S. et al., AlGaN˜GaN polarization-doped field-effect transistor for microwave power applications, Applied Physics Letters, vol. 84, No. 9, pp. 1591-1593, Mar. 2004.

Zhang, K., et all, "High-linearity AlGaN/GaN FinFETs for microwave power applications", IEEE Electron Device Letters, vol. 38, No. 5, pp. 615-618, May 2017.

Final Office Action from U.S. Appl. No. 16/101,294 (unpublished; non-publication requested), dated Oct. 30, 2019.

\* cited by examiner

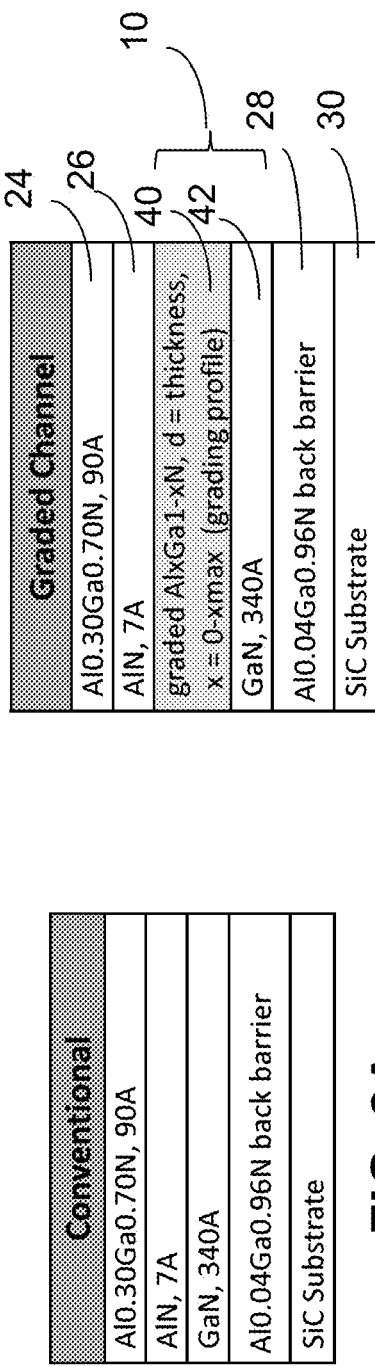
FIG. 2A
FIG. 2C
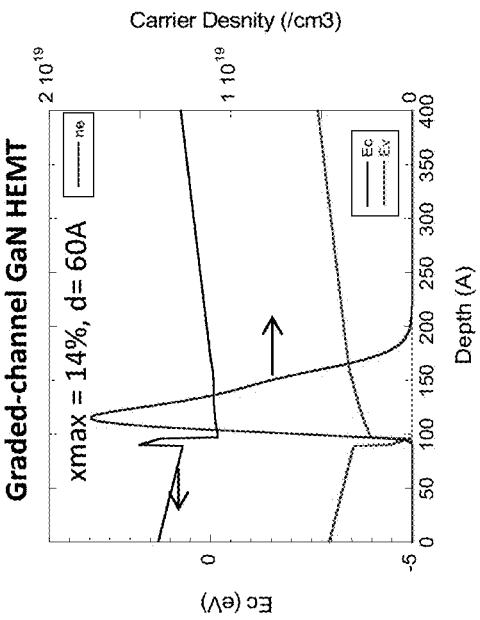
FIG. 2B
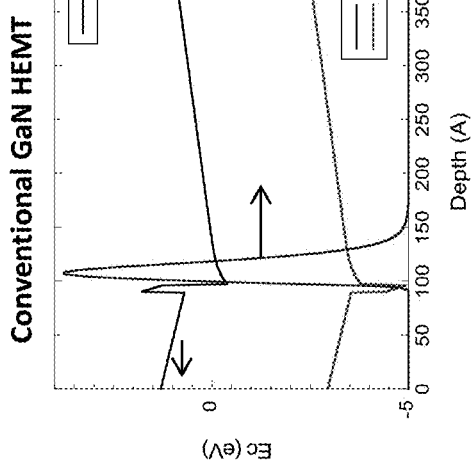
FIG. 2D

HIGHLY SCALED LINEAR GAN HEMT STRUCTURES

CROSS REFERENCE TO RELATED APPLICATIONS

This application is related to and claims priority from U.S. Provisional Patent Application Ser. No. 62/630,688, filed Feb. 14, 2018, which is incorporated herein by reference as though set forth in full.

STATEMENT REGARDING FEDERAL FUNDING

This invention was made under U.S. Government contract N00014-14-C-0140. The U.S. Government has certain rights in this invention.

TECHNICAL FIELD

This disclosure relates to GaN high electron mobility transistors (HEMTs).

BACKGROUND

In general, transistor linearity is defined in terms of a linearity figure-of-merit (LFOM) of the output third-order intercept point $OIP3/P_{DC}$. Most existing semiconductor technologies are limited to a LFOM of 10 dB. Exceptions include doped-channel GaAs MESFETs with a LFOM of ~50 dB, as described in Reference 1 below, which is incorporated herein by reference, graded-channel GaAs MESFETs with a LFOM of 128 dB after load match, as described as described in Reference 2 below, which is incorporated herein by reference, and double (i.e., front-side and back-side) pulse-doped InP HEMTs with a LFOM of 41 dB, as described in Reference 3 below, which is incorporated herein by reference. These LFOM improvements are due to transistor structures with a distributed doping profile, resulting in a reduction in nonlinearities of $g_m$ and $C_{gs}$. Unfortunately, these GaAs MESFETs have degraded channel mobility, transconductance, and noise figures, all of which limit their practical use in low-noise and high-linearity receiver applications. Double-pulse-doped InP HEMTs can offer high $f_T/f_{max}$ and low noise at millimeter-wave (mmW) frequencies, but their LFOM degrades quickly above a −20 dBm power level due to their low breakdown voltage. This degradation limits their use in receiver applications with a high peak-to-average power ratio (e.g., 10.6 for Wideband Code Division Multiple Access (WCDMA) and ~12 for Orthogonal Frequency Division Multiplexing (OFDM) and for in-band interferers). The highest reported LFOM in HBT devices is ~11 dB for a GaAs HBT due to the nonlinearities from transconductance and base-collector capacitance, as described in Reference 4 below, which is incorporated herein by reference. These HBT devices also typically have a higher noise figure than HEMT devices. The reported LFOM of conventional GaN HEMTs, as described in Reference 5 below, which is incorporated herein by reference, GaN FINFETs, as described in Reference 6 below, which is incorporated herein by reference, and carbon nanotube FETs, as described in Reference 7 below, which is incorporated herein by reference, are less than 10 dB.

Recently, GaN FETs with graded AlGaN channels have been reported to show a promising linearized $g_m$ over gate voltage, though no measured linearity data was reported, and the reported device transconductance was low, 93 mS/mm or ~159 mS/mm, as described in References 8 and 9 below, which are incorporated herein by reference. These devices also have a low mobility (524 $cm^2$/Vs).

Most importantly, the best LFOMs of prior art semiconductor technologies are obtained around ~0.5 $I_{ds}$, while the best noise figures are obtained near ~0.2 $I_{ds}$ bias point due to the channel temperature rise. Hence, the device linearity versus noise figure of the prior art transistors has been inevitably compromised.

A composite-channel GaN HEMT has been described in Reference 10 below, which is incorporated herein by reference, and has shown that double-channel GaN heterostructures improve the access resistance. However, the authors describe removing the top channel within the channel area, while keeping the double-channel in the source and drain ohmic areas, making the active channel area of this device effectively that of a signal-channel GaN HEMT.

REFERENCES

The references below are incorporated herein by reference as though set forth in full.

1. S. L. G. Chu, J. Huang, W. Struble, G. Jackson, N. Pan, M. J. Schindler, and Y. Tajima, "A highly linear MESFET", IEEE MTT-S Digest, 1991.
2. P. K. Ikalainen, L. C. Witkowski, and K. R. Varian, "Low noise, low DC power linear FET", Microwave Conference, 1992.
3. K. Y. Hur, K. T. Hetzler, R. A. McTaggart, D. W. Vye, P. J. Lemonias, and W. E. Hoke, "Ultralinear double pulse doped AlInAs/GaInAs/InP HEMTs", Electronics Letters, vol. 32, p. 1516, 1996.
4. M. Iwamoto, P. M. Asbeck, T. S. Low, C. P. Hutchinson, J. B. Scott, A. Cognata, X. Qin, L. H. Camnitz, and D. C. D'Avanzo, "Linearity characteristics of GaAs HBTs and the influence of collector design", IEEE Trans. Microwave Theory and Techniques, vol. 48, p. 2377, 2000.
5. J. Moon, M. Micovic, A. Kurdoghlian, R. Janke, P. Hashimoto, W.-S. Wong, and L. McCray, "Linearity of low microwave noise AlGaN/GaN HEMTs", Electronics Letters, vol. 38, p. 1358, 2002.
6. K. Zhang, Y. Kong, G. Zhu, J. Zhou, X. Yu, C. Kong, Z. Li, and T. Chen, "High-linearity AlGaN/GaN FinFETs for microwave power applications", IEEE Electron Device Letters, vol. 38, p. 615, 2017.
7. Y. Cao, G. J. Brady, H. Gui, C. Rutherglen, M. S. Arnold, and C. Zhou, "Radio frequency transistors using aligned semiconducting carbon nanotubes with current-gain cutoff frequency and maximum oscillation frequency simultaneously greater than 70 GHz", ACS Nano, vol. 10, p. 6782, 2016.
8. S. Rajan et al., Applied Physics Letters, vol. 84, p. 1591, 2004.
9. P. Park et al., Applied Physics Letters, vol. 100, p. 063507, 2012.
10. T. Palacios et al., IEEE Trans. Electron Devices, vol. 53, p. 562, 2006.
11. J. S. Moon et al., IEEE Electron Dev. Lett., 37, 272-275 (2016).
12. J.-S. Moon et al., 2016 IEEE Topical Conference on Power Amplifiers for Wireless and Radio Applications (PAWR), 5-7 (2016).

What is needed is an improved GaN HEMT with a high linearity figure-of-merit (LFOM) with reduced spectral distortion, which is important to meet demanding spectral efficiency requirements in wireless communications. The embodiments of the present disclosure answer these and other needs.

SUMMARY

In a first embodiment disclosed herein, a transistor comprises a substrate, a channel layer coupled to the substrate, a source electrode coupled to the channel layer, a drain electrode coupled to the channel layer, and a gate electrode coupled to the channel layer between the source electrode and the drain electrode, wherein the gate electrode has a gate length dimension of less than 50 nanometers near the channel layer, and wherein the channel layer comprises at least a first GaN layer, and a first graded AlGaN layer on the first GaN layer.

In another embodiment disclosed herein, a transistor comprises a substrate, a channel layer coupled to the substrate, a source electrode coupled to the channel layer, a drain electrode coupled to the channel layer, a first gate electrode coupled to the channel layer between the source electrode and the drain electrode, and a second gate electrode coupled to the channel layer between the first gate electrode and the drain electrode, wherein the first gate electrode has a gate length dimension of less than 50 nanometers near the channel layer, and wherein the channel layer comprises at least a first GaN layer; and a first graded AlGaN layer on the first GaN layer.

In yet another embodiment disclosed herein, a method of providing a transistor comprises providing a substrate, providing a channel layer coupled to the substrate, providing a source electrode coupled to the channel layer, providing a drain electrode coupled to the channel layer, and providing a gate electrode coupled to the channel layer between the source electrode and the drain electrode, wherein the gate electrode has a gate length dimension of less than 50 nanometers near the channel layer, and wherein the channel layer comprises at least a first GaN layer, and a first graded AlGaN layer on the first GaN layer.

In still another embodiment disclosed herein, a method of providing a transistor comprises providing a substrate, providing a channel layer coupled to the substrate, providing a source electrode coupled to the channel layer, providing a drain electrode coupled to the channel layer, providing a first gate electrode coupled to the channel layer between the source electrode and the drain electrode, and providing a second gate electrode coupled to the channel layer between the first gate electrode and the drain electrode, wherein the first gate electrode has a gate length dimension of less than 50 nanometers near the channel layer, and wherein the channel layer comprises at least a first GaN layer, and a first graded AlGaN layer on the first GaN layer.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 2A, 2B, 2C, 2D, 2E, 2F, and 2G show the structure and performance of a conventional GaN HEMT device, as shown in FIGS. 2A and 2B, compared to the structure and performance of a graded channel GaN HEMT structure, as shown in FIGS. 2C, 2D and 2E, which show greatly reduced $g_m$ nonlinearity over a wide range of gate voltages compared to the conventional GaN HEMT device, and FIGS. 2F and 2G show grading profiles versus a thickness of the graded channel in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes GaN HEMT devices that have a graded and/or a composite channel structure, and a single or a dual-gate structure on top of the channel structure. These GaN HEMT devices may also have a very short gate length. These GaN HEMT devices have applications including linear amplifiers, for example power amplifiers and low-noise amplifiers. The devices of the present disclosure provide linear RF/MW/mm-wave signal amplification with greatly reduced spectral distortion, which is important to meet demanding spectral efficiency requirements in wireless communications.

The graded-channel and composite-channel structures of the present disclosure can achieve a high LFOM at low-current, receiver-relevant bias conditions where noise figure is optimized.

As described in References 8 and 9, above, graded-channel GaN FET structures have been shown to have a linearized $g_m$ over a range of gate voltages. However, their device transconductances are low, 93 mS/mm and ~159 mS/mm, respectively, and their graded-channel GaN heterostructures have a low mobility of about 524 cm²/Vs. The present disclosure describes a vertically-scaled, graded-channel GaN HEMT with optimized front and back barrier structures to maintain the channel doping and mobility.

Also, as described in Reference 10, above, the use of double-channel GaN heterostructures have been used to improve the access resistance. In the described device implementation, the top channel of the heterostructure is removed within the channel area of the active device, while the double-channel structure in the source and drain ohmic areas is kept. Thus, the effective active channel area is that of a single-channel GaN HEMT. The present disclosure utilizes a dual-channel GaN heterostructure to improve linearity via $g_m$ nonlinearity cancellation, rather than to improve access resistance.

Figure 1A:
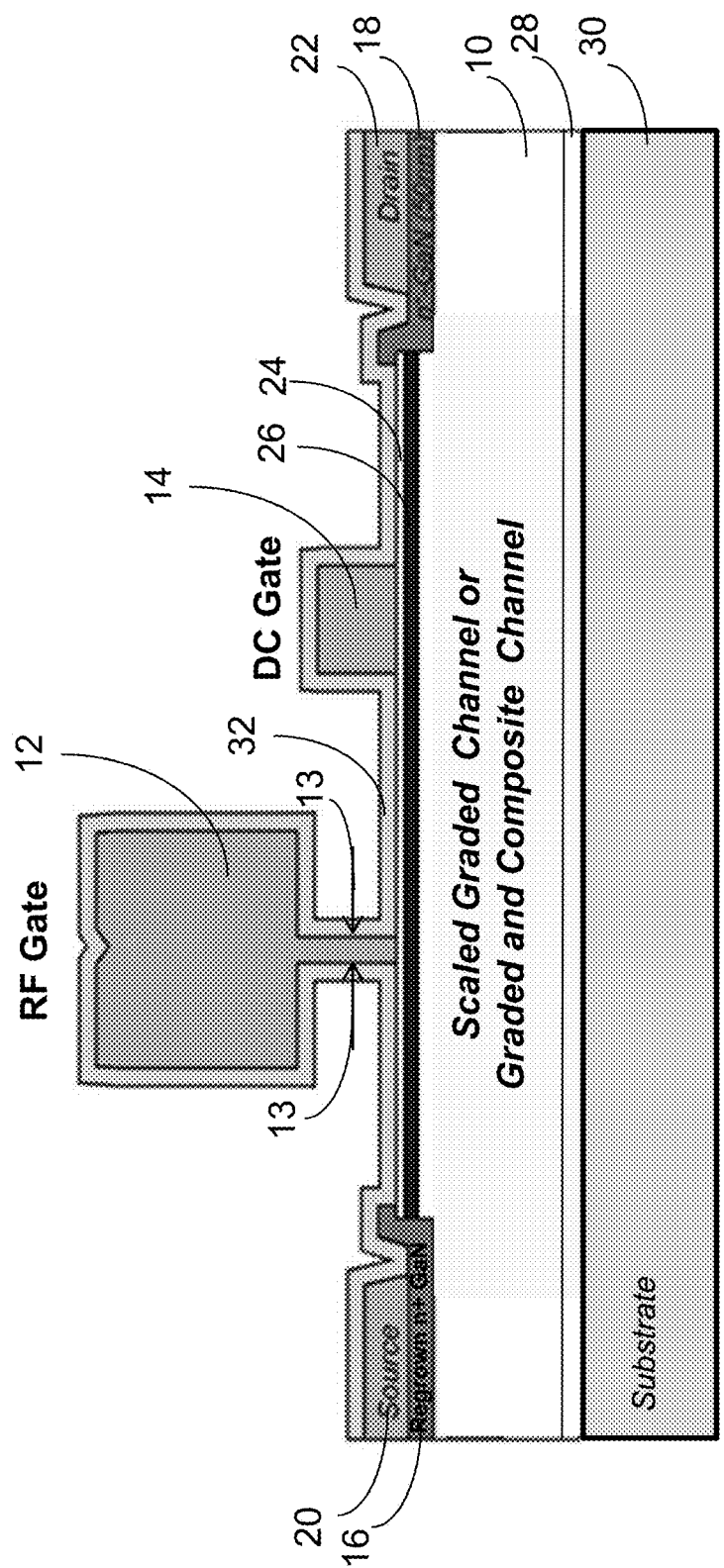
FIG. 1A shows a scaled linear GaN HEMT structure with a dual-gate structure having a radio frequency (RF) gate and a direct current (DC) gate in accordance with the present disclosure.

FIG. 1A shows a dual-gate linear GaN HEMT device having a channel layer 10 that is either a scaled, graded channel layer or a graded and composite channel layer in accordance with the present disclosure. The dual-gate device has one RF gate 12 and one DC gate 14 on top of the channel 10. The ohmic contacts 16 and 18 under the source 20 and the drain 22, respectively, may be regrown n+GaN, as shown in FIG. 1A. The ohmic contacts 16 and 18 may, for example, have a 50 nm thickness, as shown in FIG. 1A. A barrier layer 24, which may for example be $Al_{0.30}Ga_{0.70}N$, may be over an AlN layer 26 on the channel layer 10. A back barrier layer 28, which may be $Al_{0.04}Ga_{0.96}N$, may be between the substrate 30 and the channel layer 10. The surface of the device may be passivated with a dielectric layer 32, which may be SiNx.

Figure 1B:
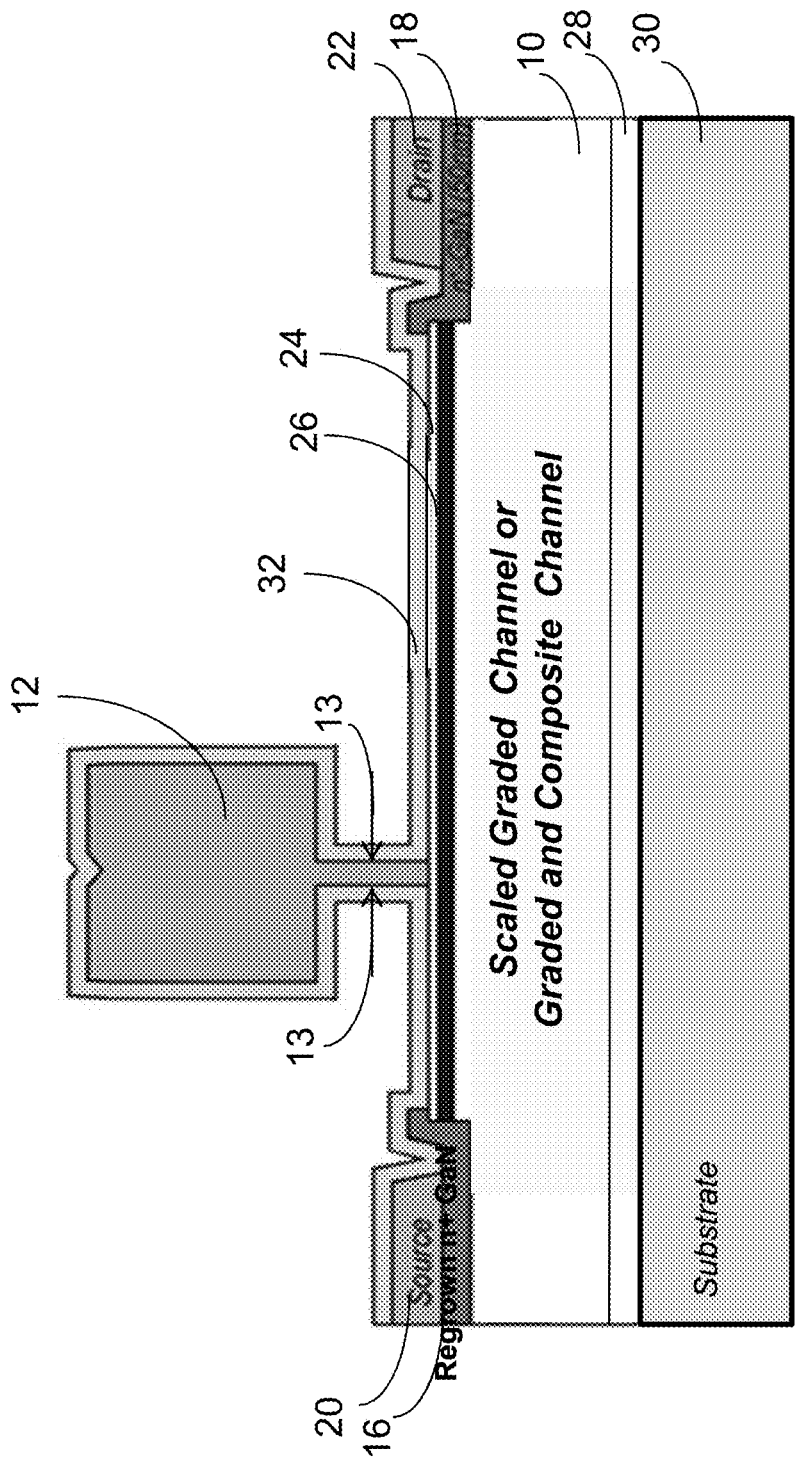
FIG. 1B shows a scaled linear GaN HEMT structure with a single gate in accordance with the present disclosure.

FIG. 1B shows a single-gate linear GaN HEMT device having a channel 10 that is either a scaled, graded channel layer or a graded and composite channel layer in accordance with the present disclosure. The single gate device has one RF gate 12 on top of the channel layer 10. The ohmic contacts 16 and 18 under the source 20 and the drain 22, respectively, may be regrown n+GaN, as shown in FIG. 1B. A barrier layer 24, which may be for example $Al_{0.30}Ga_{0.70}N$, may be over an AlN layer 26 on the channel layer 10. A back barrier layer 28, which may be $Al_{0.04}Ga_{0.96}N$, may be between the substrate 30 and the channel layer 10. The surface of the device may be passivated with a dielectric layer 32, which may be SiNx.

The disclosed GaN HEMT devices of FIGS. 1A and 1B can realize revolutionary advances in the linearity FOM (LFOM =$OIP3/P_{DC}$) with the scaled, graded channel layer or the graded and composite channel layer 10, and by dramatically scaling the dual-gate transistor architecture in the case of FIG. 1A to a very short gate length 13. With these key device innovations, the high-linearity mmW GaN HEMT devices of the present disclosure can simultaneously achieve an improved $OIP3/P_{DC}$, a low noise figure, and a high gain, which has been difficult to achieve in the prior art transistors.

The key innovations shown in the GaN HEMT devices of FIGS. 1A and 1B include: epitaxial GaN HEMT channel structures, including: polarization-doped, graded-channel structures with control of saturation velocity and charge distribution to engineer the $g_m$ profile and minimize $g_m$ and $C_{gs}$ nonlinearities without degrading channel mobility; vertical stacking of multiple-channels into composite channel GaN HEMT structures to further engineer $g_m$ nonlinearity at low quiescent current densities close to receiver bias points; and vertical-scaling of novel graded-composite-channel structures to deliver a high $g_m$ value of greater than 700 mS/mm unlike conventional MESFET structures.

The GaN HEMT device of FIGS. 1A and 1B have a laterally-scaled gate structure, which includes a short, scaled length 13 of the RF gate 12 to improve the noise figure and gain without $R_{ds}$ dispersion. The scaled gate 12 has a narrow portion of length 13, which may be only 40 to 50 nanometers, and in general is less than or equal to 50 nanometers. In addition, the GaN HEMT device of FIG. 1A includes DC gate 14 to form a dual-gate architecture to reduce $R_{ds}$ and $C_{gd}$ nonlinearities, which may be issues in short gate length devices.

Figure 2E:
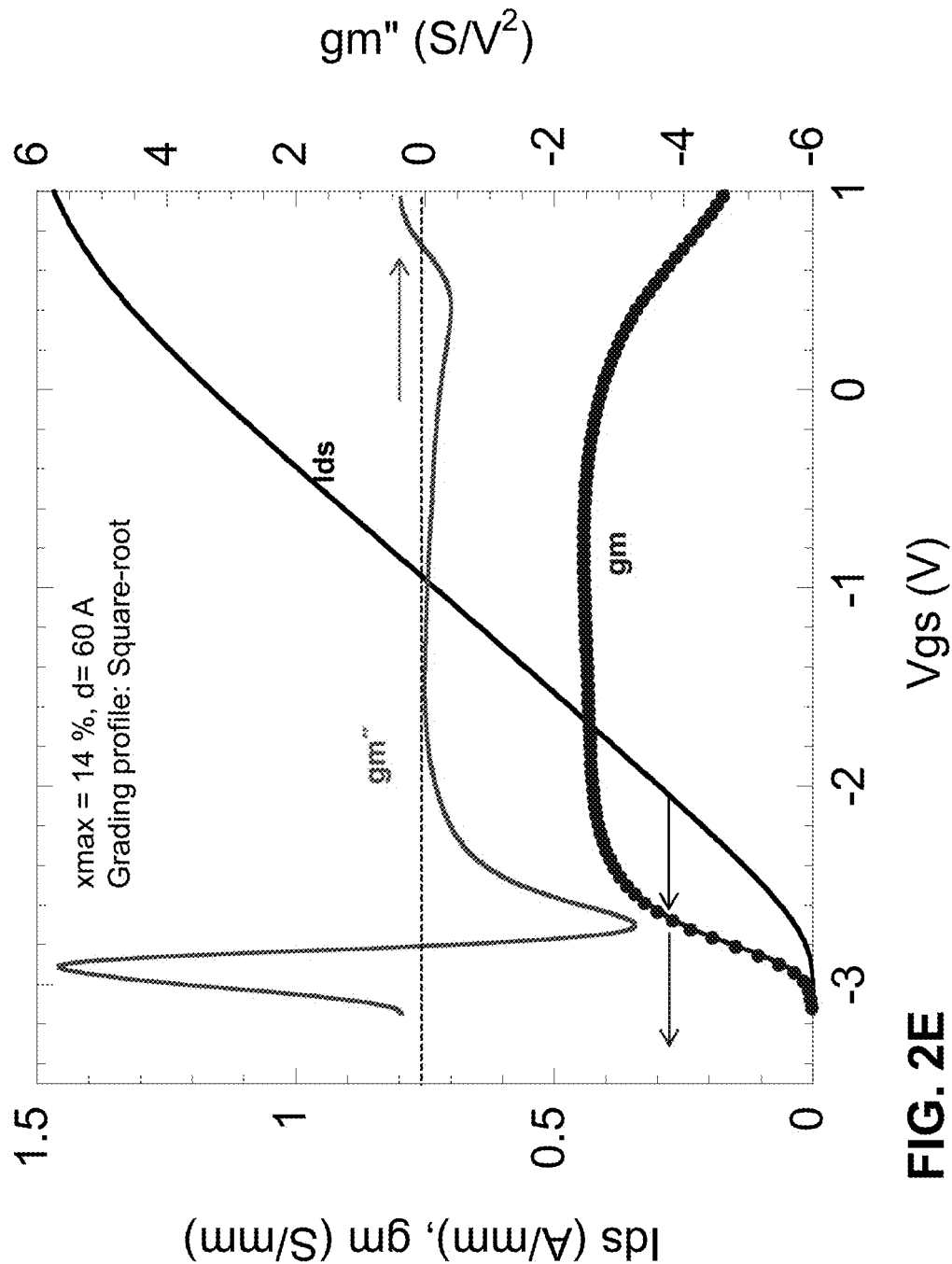

FIGS. 2A, 2B, 2C, 2D and 2D show the structure and performance of a conventional GaN HEMT device, as shown in FIGS. 2A and 2B, compared to the structure and performance of a graded channel GaN HEMT structure, as shown in FIGS. 2C, 2D and 2E. The prior art devices are optimized for high frequency, and have a maximum LFOM of 10 dB with an $I_{ds}$ of about 700 mA/mm. The graded channel GaN HEMT structure of the present disclosure has a significantly reduced $g_m$ nonlinearity over a wide range of gate voltages compared to the prior art GaN HEMT devices. The LFOM of the graded channel device of the present disclosure may have an LFOM greater than 20 dB at an $I_{ds}$ of about 450 mA/mm.

Figure 2F:
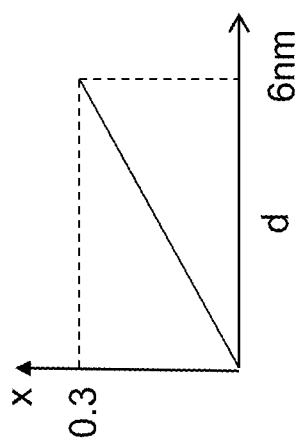
Figure 2G:
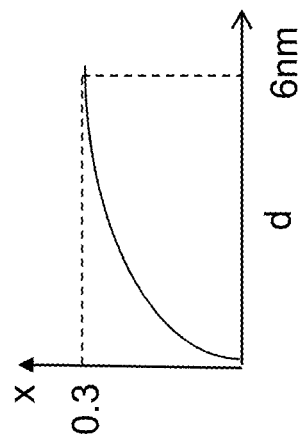

FIG. 2C shows one embodiment of structure for the GaN HEMT graded channel layer 10. The graded channel layer 10 shown in FIG. 2C has an AlGaN graded-channel layer 40 over a GaN layer 42, which may be 340 Angstrom thick. The graded channel layer 40 may be $Al_xGa_{1-x}N$ with a thickness of d. FIG. 2D shows an example of the charge density vs. depth for $x_{max}$=14% and d=60 Angstroms or 6 nanometers. FIGS. 2F and 2G show grading profiles versus a thickness d of the graded channel. The grading profile of the $Al_xGa_{1-x}N$ graded-channel layer 40 may vary from x=0 to $x_{max}$=0.1 over the thickness d of the graded channel layer 40 or may vary from x=0 to $x_{max}$=0.3 over the thickness d of the graded channel layer 40. The thickness d of the graded channel layer 40 may be up to a maximum of 60 Angstroms or 6 nanometers or less than 60 Angstroms or 6 nanometers.

As shown in FIG. 2F, x may increase linearly with increasing thickness d, or as shown in FIG. 2G, x may be proportional to the square root of d. For example, x may be equal to $0.3*d^{1/2}/(6\ nm)^{1/2}$. These are non-limiting examples of the grading profile of the $Al_xGa_{1-x}N$ graded-channel layer 40.

A Schottky barrier layer 24, which may be for example, $Al_{0.27}Ga_{0.73}N$ or $Al_{0.3}Ga_{0.7}N$, may be over the graded channel layer 10, and may have a thickness of 90 Angstroms. An AlN layer 26 may be between the Schottky barrier layer 24 and the graded channel layer 10, and may be about 7 Angstroms thick, as shown in FIG. 2C.

A back barrier 28, which may for example be $Al_{0.04}Ga_{0.96}N$, may be between the GaN layer 42 and the substrate 30, as shown in FIG. 2C.

As shown in FIG. 2E, which displays modeled device performance for the case where $V_{dd}$=3V, the $g_m$ is flat over a large bias range with a relatively high peak $g_m$ of 430 mS/mm. The $g_m$ nonlinearity, which is $g_m''=d^2g_m/dV_{gs}^2$, the second derivative, or curvature, of $g_m$ versus $V_{gs}$, is approaching zero near $V_{gs}$=−1.4 V, as shown in FIG. 2E.

Figure 3A:
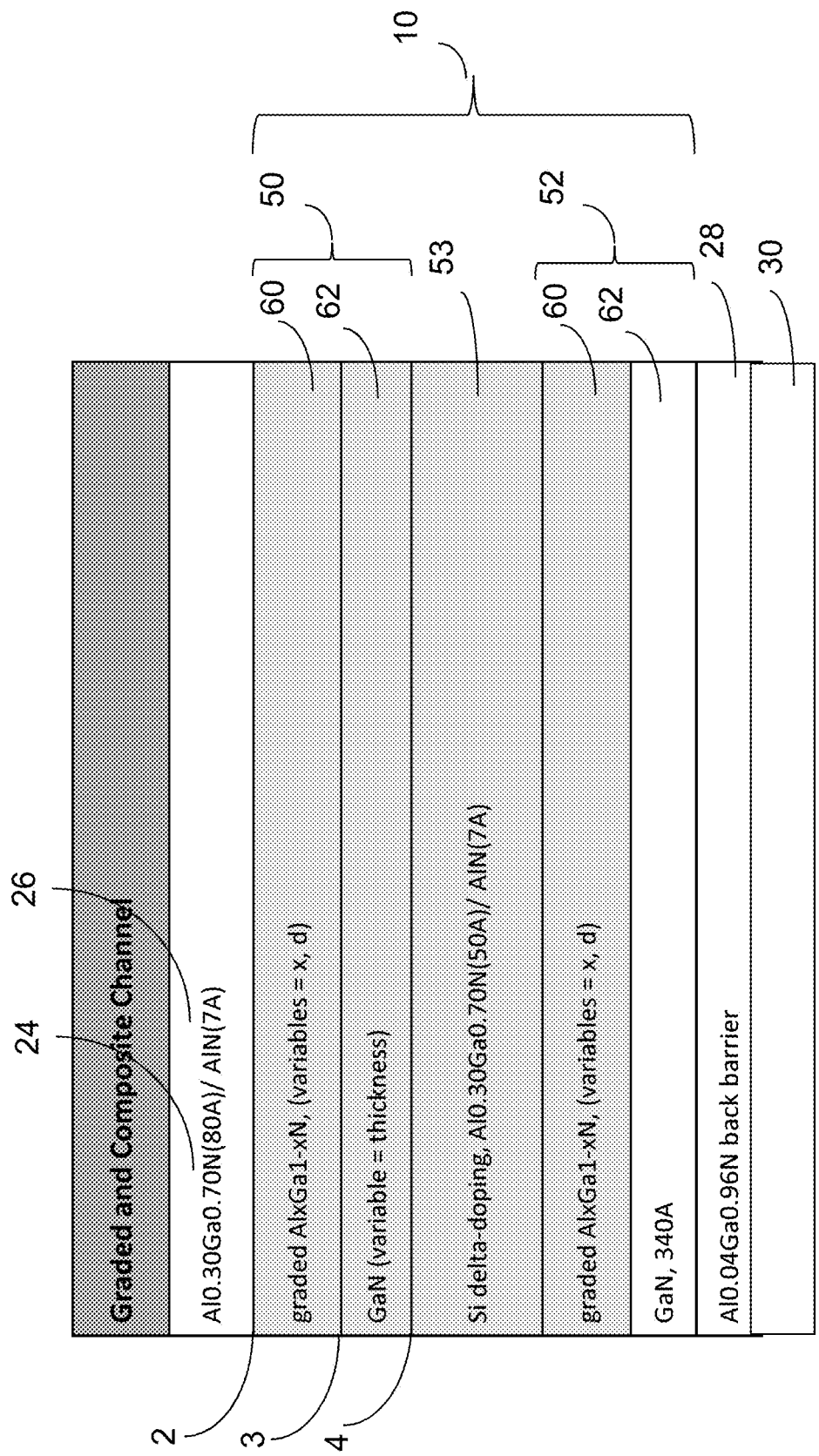
FIG. 3A shows a graded and composite channel GaN HEMT structure.
Figure 3B:
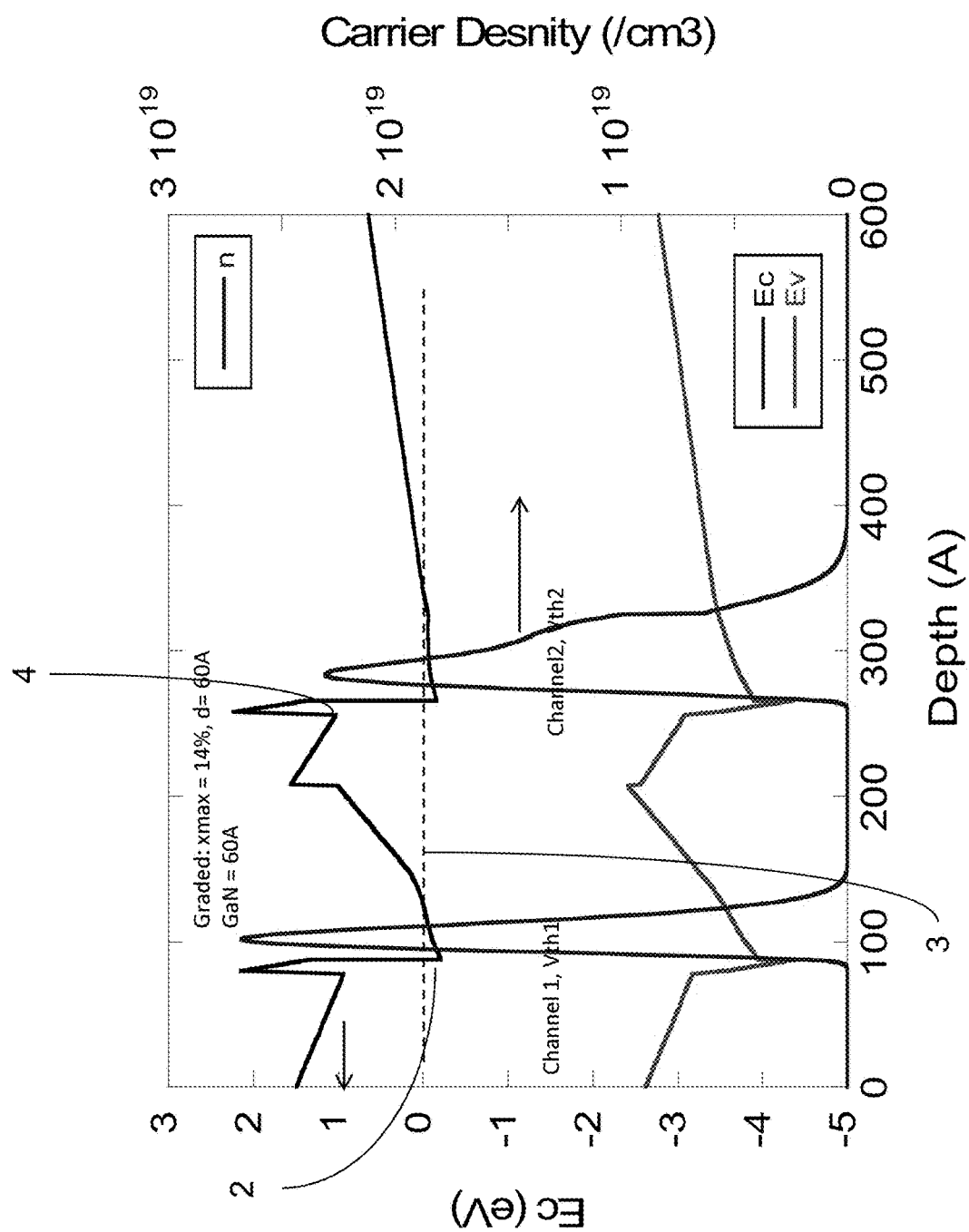
FIGS. 3B and 3C show graphs of the carrier density vs. depth and characteristics of the top channel, the bottom channel, and the dual composite channel, respectively, in accordance with the present disclosure.
Figure 3C:
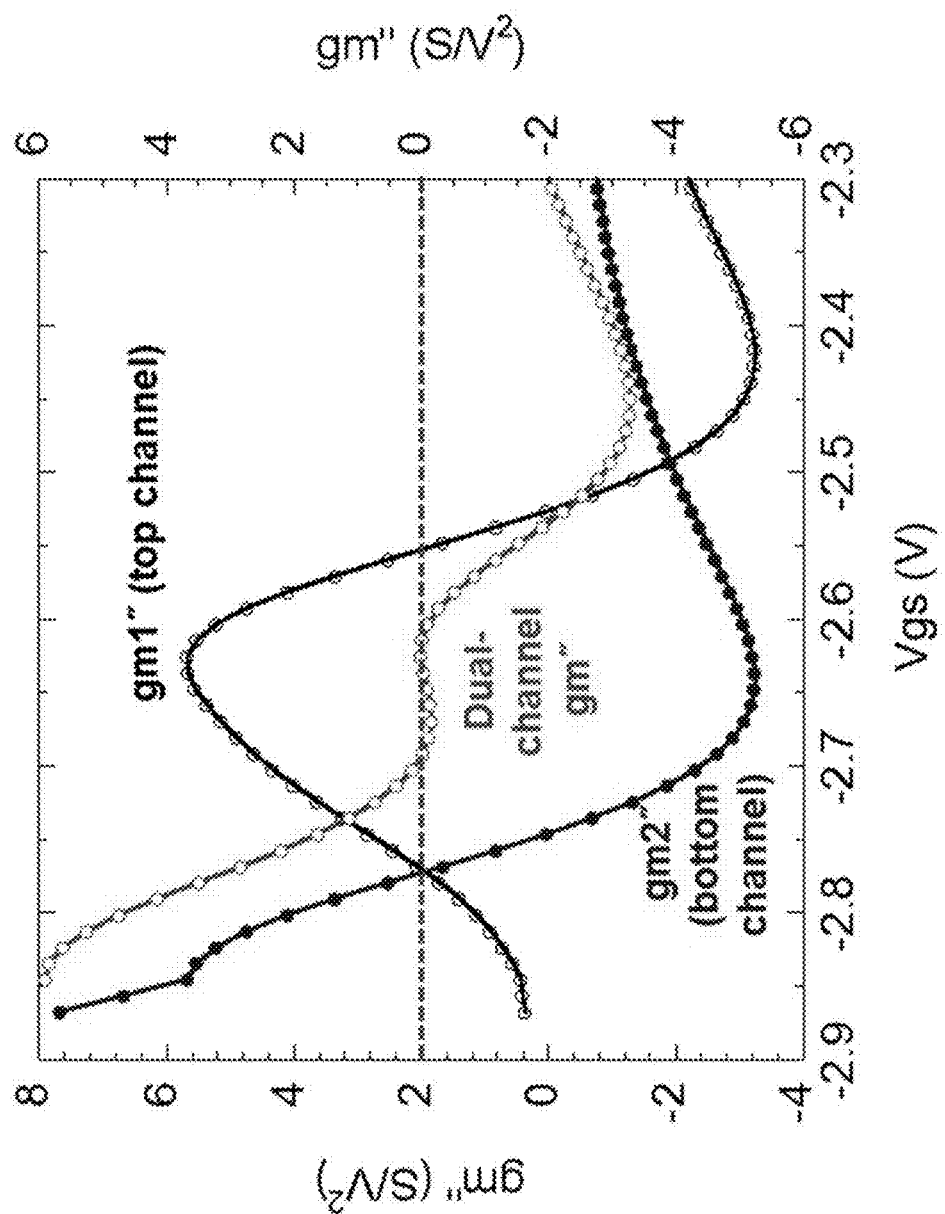

FIG. 3A shows a GaN HEMT graded and composite channel GaN HEMT structure, and FIG. 3B show a graph of the modeled GaN HEMT bandstructure. FIG. 3A shows a GaN HEMT having a graded and composite channel layer 10 including two graded channels 50 and 52 in a vertically-stacked composite structure for optimization of $g_m$ nonlinearity ($g_m''=d^2g_m/dV_{gs}^2$) at low quiescent $I_{ds}$ down to approximately a 250 mA/mm level. The graded and composite channel layer 10 improves the noise figure (NF) and LFOM by reducing direct current (DC) power consumption. The graded and composite channel 10 has two different superimposed threshold voltages ($V_{th}$). The linear superposition of the $g_m$ of the top graded channel 50 with the $g_m$ of the bottom channel 52 results in a near cancellation of the $g_m$ nonlinearity near the low $I_{ds}$ level, as shown in FIG. 3C. FIG. 3C shows that the $g_m''$ approaches zero both at lower quiescent $I_{ds}$ and over a range of $I_{ds}$. By incorporating multiple graded channels with slowly-varying $g_m''$ into the composite-channel structures, the range may be extended over which $g_m''$ is minimized to low $V_{gs}$ and quiescent $I_{ds}$.

An $Al_{0.3}Ga_{0.7}N$ Schottky barrier layer 24 may be over the graded channel layer 50, and may for example have a thickness of about 80 to 90 Angstroms. An AlN layer may be between the Schottky barrier layer 24 and the graded channel layer 50, and may be about 7 Angstroms thick, as shown in FIG. 3A.

A back barrier 28, which may for example be $Al_{0.04}Ga_{0.96}N$, may be between the GaN layer 62 and the substrate 30, as shown in FIG. 3A.

Each of the graded channel layers 50 and 52 may have a composition similar to the graded channel 10 described above for FIG. 2C.

A Si delta-doping layer 53 having a layer of which may be $Al_{0.3}Ga_{0.7}N$ with a thickness of about 50 Angstroms on a layer of AlN having a thickness of about 7 Angstroms may be between the graded channel 50 and the graded channel 52. The purpose of the Si delta-doping layer 53 between graded channels 50 and 52 is to bring the conduction band below the fermi level so that electrons are available for the next graded channel. There may be multiple sets of a graded channel, a Si delta-doping layer and a graded channel. Adjacent graded channels are preferably separated by a Si delta doping layer 53.

In FIG. 3A, the reference numbers 2, 3, and 4 which are at interfaces between the AlN layer 26 and graded channel 50, between the graded portion 60 of graded channel 50 and the GaN layer 62 of graded channel 50, and between the graded channel 50 and the Si delta doping layer 53, respectively, correspond to the reference numbers 2, 3, and 4 shown in FIG. 3B, which graphs the carrier density versus device depth.

Figure 4B:
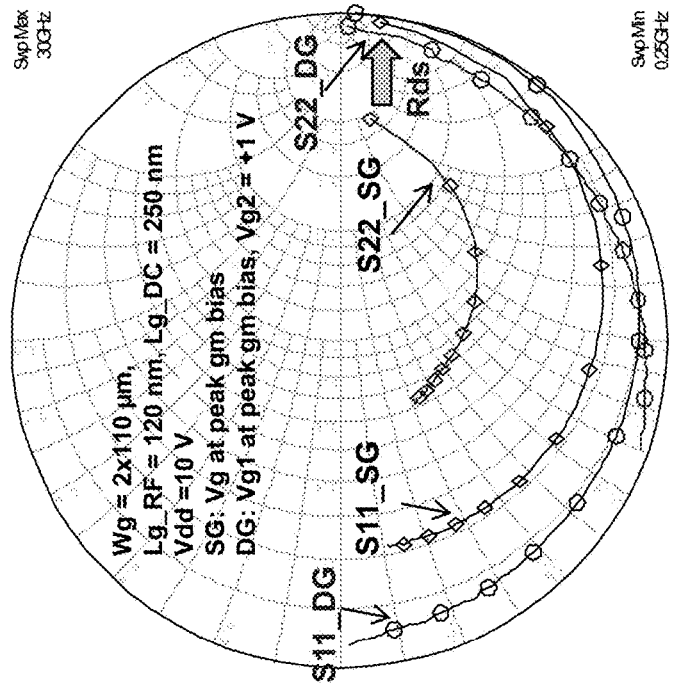
FIG. 4B shows measured S-parameters of a single gate and a dual-gate, showing $R_{ds}$ improvement along with $C_{gd}$ reduction.
Figure 4A:
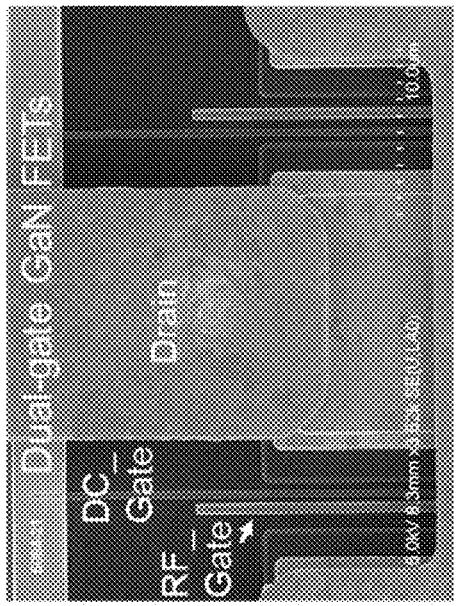
FIG. 4A shows a SEM image of a fabricated dual-gate GaN HEMT device having the structure depicted in FIG. 1A with a 40 nm RF gate length within a 1.2 µm source-drain spacing for X-band.
Figure 4C:
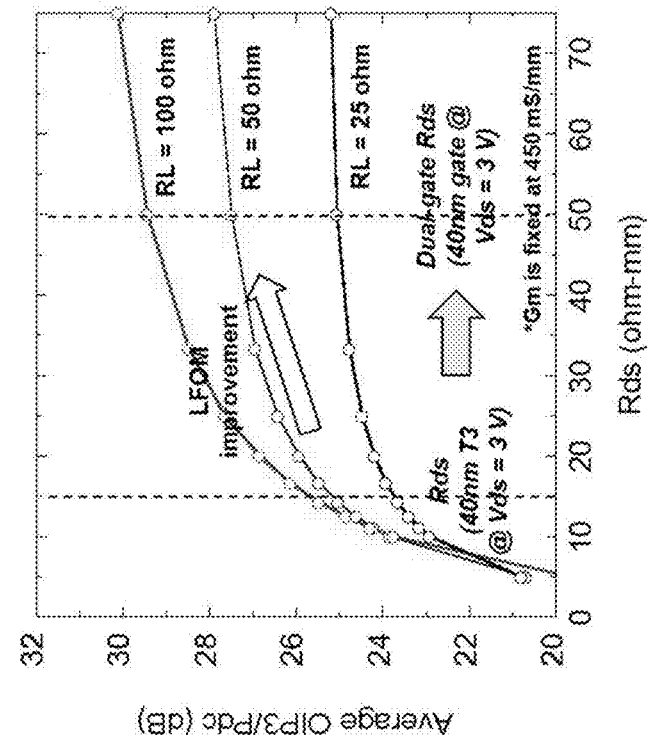
FIG. 4C shows a calculated $R_{ds}$ of the disclosed device layout, which is given by the sum of $R_{ds}$ for a 40 nm RF gate and that of a 150 nm DC gate in accordance with the present disclosure.

FIG. 4A shows a SEM image of a fabricated dual-gate GaN HEMT device for the device of FIG. 1A with a 40 nm RF gate length within a 1.2 μm source-drain spacing for X-band operation. FIG. 4B shows measured S-parameters of a single gate (SG) device and a dual-gate (DG) device, showing $R_{ds}$ improvement along with $C_{gd}$ reduction. FIG. 4C shows a calculated $R_{ds}$ for the device layout, which is given by the sum of $R_{ds}$ for a 40 nm RF gate with that of a 150 nm DC gate. The dual-gate device, shown in FIG. 1A, mitigates $R_{ds}$ and $C_{gd}$ nonlinearity, especially in short gate-length devices. FIG. 4C shows $R_{ds}$ values of short-gate length GaN devices. At $V_{dd}=3V$, the $R_{ds}$ for $L_g=40$ nm and $L_g=150$ nm are 15 ohm-mm and 35 ohm-mm, respectively. The $R_{ds}$ of dual-gate devices is a sum of $R_{ds}$ of the DC gate and the RF gate. The total $R_{ds}$ is therefore 50 ohm-mm which is a desirable design target for $R_{ds}$. The $R_{ds}$ can easily be further increased by increasing the DC gate length. Fabrication of dual-gate GaN HEMT devices has been described in Reference 11 above. As shown in FIG. 4C, the Rds can be improved from 15 ohm-mm for a 40 nm single-gate GaN HEMT to 50 ohm-mm for a dual-gate GaN HEMT, and the LFOM can be further enhanced by 2-3 dB.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A transistor comprising:
   a substrate;
   a channel layer coupled to the substrate;
   a source electrode coupled to the channel layer;
   a drain electrode coupled to the channel layer; and
   a gate electrode coupled to the channel layer between the source electrode and the drain electrode;
   wherein the gate electrode has a gate length dimension of less than 50 nanometers near the channel layer; and
   wherein the channel layer comprises:
      at least a first GaN layer; and
      a first graded AlGaN layer on the first GaN layer.

2. The transistor of claim 1 wherein the channel layer further comprises a composite channel comprising:
   the at least a first GaN layer;
   the first graded AlGaN layer on the first GaN layer;
   a Si delta doping layer on the first graded AlGaN layer;
   a second GaN layer on the Si delta doping layer; and
   a second graded AlGaN layer on the second GaN layer.

3. The transistor of claim 2 wherein the Si delta doping layer comprises:
   a layer of AlN; and
   a layer of AlGaN on the AlN layer.

4. The transistor of claim 1 further comprising:
   an AlGaN barrier layer on the channel layer.

5. The transistor of claim 1 further comprising:
   a back barrier layer between the substrate and the channel layer.

6. The transistor of claim 1:
   wherein the first graded AlGaN layer comprises $Al_xGA_{1-x}N$;
   wherein x varies from 0 to 0.1 over a thickness of the first graded AlGaN layer, or varies from 0 to 0.3 over the thickness of the first graded AlGaN layer; and
   wherein the thickness of the first graded AlGaN layer is 6 nanometers or less than 6 nanometers.

7. A transistor comprising:
   a substrate;
   a channel layer coupled to the substrate;
   a source electrode coupled to the channel layer;

a drain electrode coupled to the channel layer;
a first gate electrode coupled to the channel layer between the source electrode and the drain electrode; and
a second gate electrode coupled to the channel layer between the first gate electrode and the drain electrode;
wherein the first gate electrode has a gate length dimension of less than 50 nanometers near the channel layer; and
wherein the channel layer comprises:
at least a first GaN layer; and
a first graded AlGaN layer on the first GaN layer.

8. The transistor of claim 7 wherein the channel layer further comprises a composite channel comprising:
the at least a first GaN layer;
the first graded AlGaN layer on the first GaN layer;
a Si delta doping layer on the first graded AlGaN layer;
a second GaN layer on the Si delta doping layer; and
a second graded AlGaN layer on the second GaN layer.

9. The transistor of claim 8 wherein the Si delta doping layer comprises:
a layer of AlN; and
a layer of AlGaN on the AlN layer.

10. The transistor of claim 7 further comprising:
an AlGaN barrier layer on the channel layer.

11. The transistor of claim 7 further comprising:
a back barrier layer between the substrate and the channel layer.

12. The transistor of claim 7:
wherein the first graded AlGaN layer comprises $Al_xGA_{1-x}N$;
wherein x varies from 0 to 0.1 over a thickness of the first graded AlGaN layer, or varies from 0 to 0.3 over the thickness of the first graded AlGaN layer; and
wherein the thickness of the first graded AlGaN layer is 6 nanometers or less than 6 nanometers.

13. The transistor of claim 7:
wherein the first gate is a radio frequency (RF) gate; and
wherein the second gate is a direct current (DC) gate for reducing Rds and Cgd nonlinearities.

14. A method of providing a transistor comprising:
providing a substrate;
providing a channel layer coupled to the substrate;
providing a source electrode coupled to the channel layer;
providing a drain electrode coupled to the channel layer; and
providing a gate electrode coupled to the channel layer between the source electrode and the drain electrode;
wherein the gate electrode has a gate length dimension of less than 50 nanometers near the channel layer; and
wherein the channel layer comprises:
at least a first GaN layer; and
a first graded AlGaN layer on the first GaN layer.

15. The method of claim 14 further comprising:
providing a composite channel, the composite channel comprising:
the at least a first GaN layer;
the first graded AlGaN layer on the first GaN layer;
a Si delta doping layer on the first graded AlGaN layer;
a second GaN layer on the Si delta doping layer; and
a second graded AlGaN layer on the second GaN layer.

16. The method of claim 15 wherein the Si delta doping layer comprises:
a layer of AlN; and
a layer of AlGaN on the AlN layer.

17. The method of claim 14 further comprising:
providing an AlGaN barrier layer on the channel layer.

18. The method of claim 14 further comprising:
providing a back barrier layer between the substrate and the channel layer.

19. The method of claim 14:
wherein the first graded AlGaN layer comprises $Al_xGA_{1-x}N$;
wherein x varies from 0 to 0.1 over a thickness of the first graded AlGaN layer, or varies from 0 to 0.3 over the thickness of the first graded AlGaN layer; and
wherein the thickness of the first graded AlGaN layer is 6 nanometers or less than 6 nanometers.

20. A method of providing a transistor comprising:
providing a substrate;
providing a channel layer coupled to the substrate;
providing a source electrode coupled to the channel layer;
providing a drain electrode coupled to the channel layer;
providing a first gate electrode coupled to the channel layer between the source electrode and the drain electrode; and
providing a second gate electrode coupled to the channel layer between the first gate electrode and the drain electrode;
wherein the first gate electrode has a gate length dimension of less than 50 nanometers near the channel layer; and
wherein the channel layer comprises:
at least a first GaN layer; and
a first graded AlGaN layer on the first GaN layer.

21. The method of claim 20 further comprising:
providing a composite channel, the composite channel comprising:
the at least a first GaN layer;
the first graded AlGaN layer on the first GaN layer;
a Si delta doping layer on the first graded AlGaN layer;
a second GaN layer on the Si delta doping layer; and
a second graded AlGaN layer on the second GaN layer.

22. The method of claim 21 wherein the Si delta doping layer comprises:
a layer of AlN; and
a layer of AlGaN on the AlN layer.

23. The method of claim 20 further comprising:
providing an AlGaN barrier layer on the channel layer.

24. The method of claim 20 further comprising:
providing a back barrier layer between the substrate and the channel layer.

25. The method of claim 20:
wherein the first graded AlGaN layer comprises $Al_xGA_{1-x}N$;
wherein x varies from 0 to 0.1 over a thickness of the first graded AlGaN layer, or varies from 0 to 0.3 over the thickness of the first graded AlGaN layer; and
wherein the thickness of the first graded AlGaN layer is 6 nanometers or less than 6 nanometers.

26. The method of claim 20:
wherein the first gate is a radio frequency (RF) gate; and
wherein the second gate is a direct current (DC) gate for reducing Rds and Cgd nonlinearities.

* * * * *